(12) United States Patent
Kasai et al.

(10) Patent No.: US 8,164,201 B2
(45) Date of Patent: Apr. 24, 2012

(54) SEMICONDUCTOR DEVICE WITH FRONT AND BACK SIDE RESIN LAYERS HAVING DIFFERENT THERMAL EXPANSION COEFFICIENT AND ELASTICITY MODULUS

(75) Inventors: Masaki Kasai, Kyoto (JP); Osamu Miyata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 158 days.

(21) Appl. No.: 11/988,030

(22) PCT Filed: Jun. 28, 2006

(86) PCT No.: PCT/JP2006/312882
§ 371 (c)(1),
(2), (4) Date: Dec. 28, 2007

(87) PCT Pub. No.: WO2007/001018
PCT Pub. Date: Jan. 4, 2007

(65) Prior Publication Data
US 2009/0121347 A1    May 14, 2009

(30) Foreign Application Priority Data
Jun. 29, 2005  (JP) .................. 2005-189571
Jun. 29, 2005  (JP) .................. 2005-189572

(51) Int. Cl.
*H01L 23/29* (2006.01)
(52) U.S. Cl. ............... 257/788; 257/729; 257/E21.502; 438/127
(58) Field of Classification Search .................. None
See application file for complete search history.

(56) References Cited

U.S. PATENT DOCUMENTS

| 5,581,121 | A | * | 12/1996 | Burns et al. | 257/684 |
|---|---|---|---|---|---|
| 5,851,911 | A | * | 12/1998 | Farnworth | 438/614 |
| 6,121,067 | A | * | 9/2000 | Canella | 438/26 |
| 6,403,882 | B1 | * | 6/2002 | Chen et al. | 174/565 |
| 6,448,665 | B1 | * | 9/2002 | Nakazawa et al. | 257/789 |
| 6,960,494 | B2 | * | 11/2005 | Funakura et al. | 438/125 |
| 7,345,368 | B2 | * | 3/2008 | Shibata | 257/773 |
| 7,388,297 | B2 | * | 6/2008 | Tanaka | 257/790 |
| 2001/0035588 | A1 | * | 11/2001 | Aga | 257/788 |
| 2001/0040280 | A1 | * | 11/2001 | Funakura et al. | 257/679 |
| 2001/0042902 | A1 |   | 11/2001 | Wakabayashi et al. | |
| 2003/0017652 | A1 |   | 1/2003 | Sakaki et al. | |
| 2003/0038367 | A1 |   | 2/2003 | Yamaguchi | |
| 2004/0104491 | A1 | * | 6/2004 | Connell et al. | 257/787 |
| 2004/0121563 | A1 | * | 6/2004 | Farnworth et al. | 438/465 |

(Continued)

FOREIGN PATENT DOCUMENTS

JP           04-038857 A      2/1992

(Continued)

*Primary Examiner* — Marcos D. Pizarro
*Assistant Examiner* — Andrés Muñoz
(74) *Attorney, Agent, or Firm* — Rabin & Berdo, P.C.

(57) ABSTRACT

Disclosed are a semiconductor device wherein warping of a semiconductor chip due to a sudden temperature change can be prevented without increasing the thickness, and a semiconductor device assembly. The semiconductor device comprises a semiconductor chip, a front side resin layer formed on the front surface of the semiconductor chip by using a first resin material, and a back side resin layer formed on the back surface of the semiconductor chip by using a second resin material having a higher thermal expansion coefficient than the first resin material. The back side resin layer is formed thinner than the front side resin layer.

21 Claims, 2 Drawing Sheets

U.S. PATENT DOCUMENTS

2004/0207075 A1 10/2004 Noguchi
2004/0266139 A1* 12/2004 Shibata .................. 438/465

FOREIGN PATENT DOCUMENTS

| JP | 2000-156434 A | 6/2000 |
| JP | 2001-077231 | 3/2001 |
| JP | 2001-168231 | 6/2001 |
| JP | 2001-326299 A | 11/2001 |
| JP | 2002-270720 A | 9/2002 |
| JP | 2003-060119 | 2/2003 |
| JP | 2004-063551 A | 2/2004 |
| JP | 2004-087789 A | 3/2004 |
| JP | 2004-119552 | 4/2004 |
| JP | 2004-336020 | 11/2004 |
| JP | 2005-094040 | 4/2005 |
| WO | WO-00/48247 | 8/2000 |

* cited by examiner

SEMICONDUCTOR DEVICE WITH FRONT AND BACK SIDE RESIN LAYERS HAVING DIFFERENT THERMAL EXPANSION COEFFICIENT AND ELASTICITY MODULUS

TECHNICAL FIELD

The present invention relates to a semiconductor device and a semiconductor device assembly in a wafer state before being cut into pieces of semiconductor devices.

BACKGROUND ART

Recently, a WL-CSP (Wafer Level-Chip Size Package) which realizes downsizing, higher functionality, and higher performance of semiconductor devices has been put to practical use. Concerning the WL-CSP, the packaging process is completed in the wafer state, and individual chip sizes cut out by dicing become package sizes.

That is, in the manufacturing processes for a semiconductor device employing the WL-CSP, on the surface of a wafer in which a plurality of semiconductor chips are formed, a polyimide layer and rewiring are formed, and thereafter, a front side resin layer for sealing these is formed. After external terminals are formed on the front side resin layer, semiconductor devices of a WL-CSP having the same package size as that of the semiconductor chip are obtained by cutting (dicing) the wafer together with a passivation film and the sealing resin along dicing lines set between the respective semiconductor chips.

Patent document 1: Japanese Unexamined Patent Publication No. 2003-60119
Patent document 2: Japanese Unexamined Patent Publication No. 2004-336020

DISCLOSURE OF THE INVENTION

Problems to be Solved by the Invention

The front side resin layer is formed by applying a resin as a material of the front side resin layer onto the surface of a wafer and curing the resin on the surface of the wafer by temporarily heating and then cooling it. At this time, the resin on the surface of the wafer thermally shrinks. When such thermal shrinkage occurs, a stress is applied onto the surface of the wafer, so that the wafer warps, and as a result, function elements inside the wafer may be damaged.

In order to prevent such a warping of the wafer, it is conceivable that a back side resin layer which is made of the same material and has the same thickness as those of the front side resin layer is formed on the back surface of the wafer. Thereby, when the resins are cooled for curing after heating, the resins on the front surface and the back surface of the wafer thermally shrink in the same manner, so that the wafer can be prevented from warping.

However, when the back side resin layer with the same thickness as that of the front side resin layer is formed on the back surface of the wafer, the thickness of a semiconductor device which is obtained by cutting the wafer becomes great.

In addition, there is provided such a semiconductor device including a manufacturer name and a product number marked on the surface of the back side resin layer. As a method for marking the manufacturer name, etc., on the surface of the back side resin layer, for example, laser machining is conceivable. That is, it is possible that a laser beam is irradiated onto the surface of the back side resin layer to form fine concave grooves, thereby the manufacturer name, etc., can be engraved on the surface of the back side resin layer.

However, when the manufacturer name, etc., is engraved on the surface of the back side resin layer by means of laser machining, if the back side resin layer is made only of a resin material, due to the luster of the surface of the back side resin layer, it is difficult to visually check the manufacturer name, etc. In order to solve this problem, filler is mixed in the resin material forming the back side resin layer to reduce the luster of the surface of the back side resin layer.

However, if the amount of filler mixed in the resin material is large, the surface of the back side resin layer becomes comparatively greatly uneven due to the filler. Therefore, it becomes difficult to distinguish the concave grooves showing the manufacturer name, etc., engraved on the surface of the back side resin layer from the unevenness due to the filler, and if anything, the visibility deteriorates.

Therefore, a first object of the present invention is to provide a semiconductor device which can prevent warping of a semiconductor chip due to a sudden temperature change without an increase in thickness.

A second object of the present invention is to provide a semiconductor device assembly which can prevent warping of a substrate due to a sudden temperature change without an increase in thickness of the semiconductor device.

A third object of the present invention is to provide a semiconductor device which can improve the visibility of the manufacturer name, etc., engraved on the surface of the back side resin layer by means of laser machining.

Means for Solving the Problems

A semiconductor device of the present invention for achieving the first object includes a semiconductor chip, a front side resin layer formed on the front surface of the semiconductor chip by using a first resin material, and a back side resin layer formed to be thinner than the front side resin layer on the back surface of the semiconductor chip by using a second resin material having a higher thermal expansion coefficient than that of the first resin material.

According to this construction, a front side resin layer is formed on the front surface side of a semiconductor chip by using a first resin material, and on the back surface side thereof, a back side resin layer thinner than the front side resin layer is formed by using a second resin material having a thermal expansion coefficient higher than that of the first resin material. By forming the back side resin layer to be thinner than the front side resin layer, the thickness of the semiconductor device can be made smaller than in the case where resin layers with the same thickness are formed on the front surface side and the back surface side of a semiconductor chip. Although the back side resin layer is thinner than the front side resin layer, by using the second resin material having a thermal expansion coefficient higher than that of the first resin material forming the front side resin layer as the material of the back side resin layer, when the surface side resin layer and the back side resin layer thermally expand or thermally shrink according to a sudden temperature change, a stress applied to the back surface of the semiconductor chip from the back side resin layer can be made generally equal to a stress applied to the front surface of the semiconductor chip from the front side resin layer. Therefore, while the thickness of the semiconductor device can be prevented from increasing, warping of the semiconductor chip due to a sudden temperature change can also be prevented.

It is preferable that the second resin material has an elasticity modulus smaller than that of the first resin material. A second resin material having a small elasticity modulus is used as the material of the back side resin layer, so that although the back side resin layer is formed to be thin, the impact applied to the back side resin layer can be sufficiently absorbed, and the semiconductor chip can be sufficiently protected.

For example, when the first resin material is a bisphenol-A type epoxy resin and the second resin material is polyimide-amide, the thermal expansion coefficient of the second resin material is higher than that of the first resin material, and the elasticity modulus of the second resin material is smaller than that of the first resin material.

The semiconductor device may further include external terminals which are arranged on the front side resin layer and come into contact with electrodes on a mounting substrate when the semiconductor device is mounted on the mounting substrate.

A semiconductor device assembly of the present invention for achieving the second object includes a substrate in which a plurality of semiconductor chips are formed, a front side resin layer formed by using a first resin material on the front surface of the substrate, and a back side resin layer formed to be thinner than the front side resin layer on the back surface of the substrate by using a second resin material having a thermal expansion coefficient higher than that of the first resin material.

According to this construction, on the front surface side of a substrate, a front side resin layer is formed by using a first resin material, and on the back surface side thereof, a back side resin layer thinner than the front side resin layer is formed by using a second resin material having a thermal expansion coefficient higher than that of the first resin material. By forming the back side resin layer to be thinner than the front side resin layer, the thickness of a semiconductor device obtained by cutting the semiconductor device assembly can be made smaller than in the case where resin layers with the same thickness are formed on the front surface side and the back surface side of the substrate. Although the back side resin layer is thinner than the front side resin layer, by using the second resin material having a thermal expansion coefficient higher than that of the first resin material forming the front side resin layer as the material of the back side resin layer, when the materials of the front side resin layer and the back side resin layer are cooled for curing after heating and the materials thermally shrink, a stress applied to the back surface of the substrate can be made generally equal to a stress applied to the front surface of the substrate. Therefore, while the thickness of the semiconductor device obtained from the semiconductor device assembly can be prevented from increasing, warping of the substrate can also be prevented.

It is preferable that the second resin material has an elasticity modulus smaller than that of the first resin material. As a material of the back side resin layer, the second resin material having a small elasticity modulus is used, so that although the back side resin layer is formed to be thin, an impact applied to the back side resin layer can be sufficiently absorbed. Therefore, in the state of a semiconductor device assembly, each semiconductor chip can be sufficiently protected, and in a semiconductor device obtained from the semiconductor device assembly, a semiconductor chip can be sufficiently protected.

For example, when the first resin material is a bisphenol-A type epoxy resin and the second resin material is polyimide-amide, the thermal expansion coefficient of the second resin material is higher than that of the first resin material, and the elasticity modulus of the second resin material is smaller than that of the first resin material.

A semiconductor device of the present invention for achieving the third object includes a semiconductor chip, and a back side resin layer formed on the back surface of the semiconductor chip by using a resin material, wherein the resin material is obtained by mixing filler in a range not less than 5 weight percent and not more than 10 weight percent in the resin.

With this construction, a resin material forming a back side resin layer contains filler mixed in a range not less than 5 weight percent and not more than 10 weight percent in the resin. Thereby, while the luster on the surface of the back side resin layer can be reduced, great unevenness of the surface of the back side resin layer due to the filler can be prevented. Therefore, the visibility of the manufacturer name, etc., engraved on the surface of the back side resin layer by laser machining can be improved.

The semiconductor device may further include a front side resin layer formed on the front surface of the semiconductor chip and external terminals which are provided on the front side resin layer and come into contact with electrodes on a mounting substrate when the semiconductor device is mounted on the mounting substrate.

The above-described or other objects, features, and effects of the present invention will be made apparent by the following description of the embodiments with reference to the accompanying drawings.

BEST MODE FOR CARRYING OUT THE INVENTION

Hereinafter, embodiments of the present invention will be described in detail with reference to the accompanying drawings.

Figure 1:
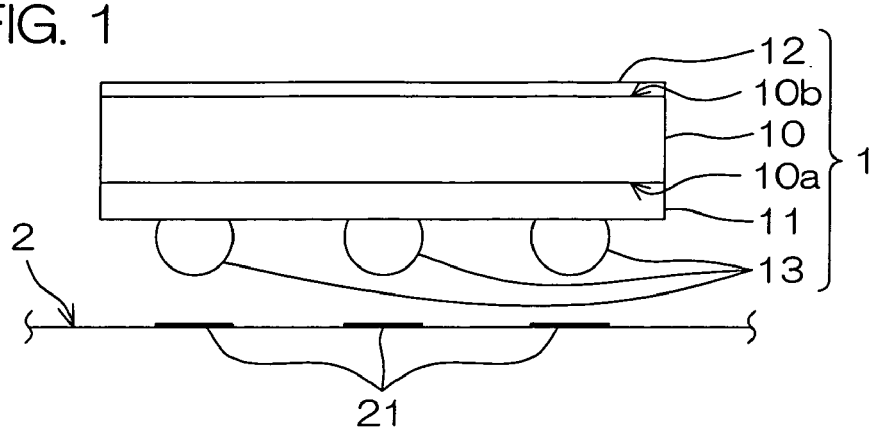
FIG. 1 A side view schematically showing a construction of a semiconductor device according to a first embodiment of the present invention.

FIG. 1 is a side view schematically showing a construction of a semiconductor device according to a first embodiment of the present invention.

This semiconductor device 1 is a semiconductor device employing a WL-CSP (Wafer Level-Chip Size Package). The semiconductor device 1 includes a semiconductor chip 10.

The semiconductor chip 10 has a thickness of, for example, 300 to 400 μm. In the surface layer portion of this semiconductor chip 10, function elements (not shown) are formed. A front surface 10a of the semiconductor chip 10 is covered by a passivation film (not shown). On the passivation film, a polyimide layer and rewiring (not shown) are formed. On the front surface 10a of the semiconductor chip 10, a front side resin layer 11 for sealing the rewiring, etc., is formed.

The front side resin layer 11 has a thickness of approximately 40 to 100 μm. This front side resin layer 11 is made of, for example, a bisphenol-A type epoxy resin which has an elasticity modulus of 16 GPa, a thermal expansion coefficient of 2.5 to 8.5 ppm/° C. at a temperature lower than the glass transition point (135° C.), and a thermal expansion coefficient of 19.0 to 44.0 ppm/° C. at a temperature not less than the glass transition point.

On the other hand, on the back surface 10b of the semiconductor chip 10, a back side resin layer 12 is formed by using a resin material which has a higher thermal expansion coefficient and a smaller elasticity modulus than those of the bisphenol-A type epoxy resin as a material of the front side resin layer 11. As a resin material having these thermal expansion coefficient and elasticity modulus, for example, polyimideamide having an elasticity modulus of 2.5 GPa and a thermal expansion coefficient of 60.0 ppm/° C. can be included. The back side resin layer 12 has a thickness of approximately 10 to 30 μm, and is formed to be thinner than the front side resin layer 11.

On the front side resin layer 11, a plurality of external terminals 13 for connection to the mounting substrate 2 are provided. The plurality of external terminals 13 are arranged in a lattice pattern at the central portion of the front side resin layer 11 side. Each external terminal 13 is formed in a ball shape, and is electrically connected to the semiconductor chip 10 of the semiconductor device 1. In this semiconductor device 1, by bringing the external terminals 13 into contact with respective lands 21 on a mounting substrate 2, mounting on the mounting substrate 2 is realized.

Thus, by forming the back side resin layer 12 to be thinner than the front side resin layer 11, the thickness of the semiconductor device can be made smaller than in the case where resin layers with the same thickness are formed on the front surface 10a side and the back surface 10b side of the semiconductor chip 10. Although the back side resin layer 12 is thinner than the front side resin layer 11, by using, as the material of the back side resin layer 12, a resin material having a thermal expansion coefficient higher than that of the resin material forming the front side resin layer 11, when the front side resin layer 11 and the back side resin layer 12 thermally expand or thermally shrink, a stress applied to the back surface of the semiconductor chip 10 from the back side resin layer 12 can be made generally equal to a stress applied to the front surface of the semiconductor chip 10 from the front side resin layer 11. Therefore, while the thickness of the semiconductor device 1 can be prevented from increasing, warping of the semiconductor chip 10 due to a sudden temperature change can be prevented.

As the material of the back side resin layer 12, polyimideamide having a comparatively small elasticity modulus is used, so that although the back side resin layer 12 is formed to be thin, an impact applied to the back side resin layer 12 can be sufficiently absorbed, and the semiconductor chip 10 can be sufficiently protected.

Figure 2:
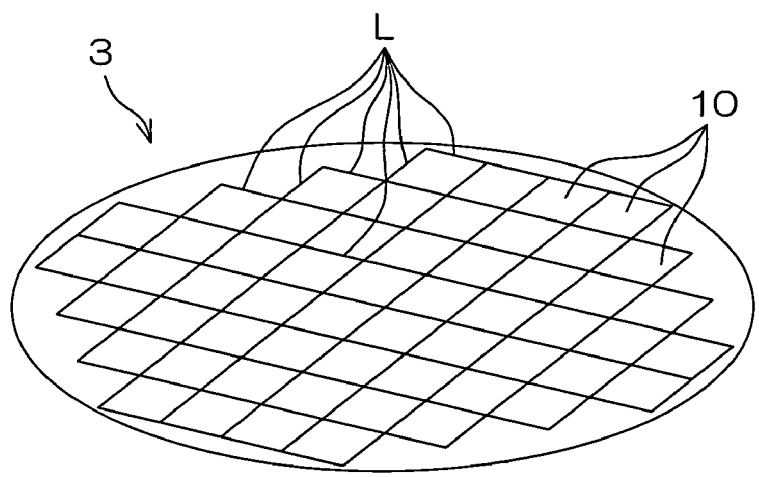
FIG. 2 A perspective view of a semiconductor device assembly formed of an assembly of semiconductor devices shown in FIG. 1 observed from the surface side.
Figure 3:
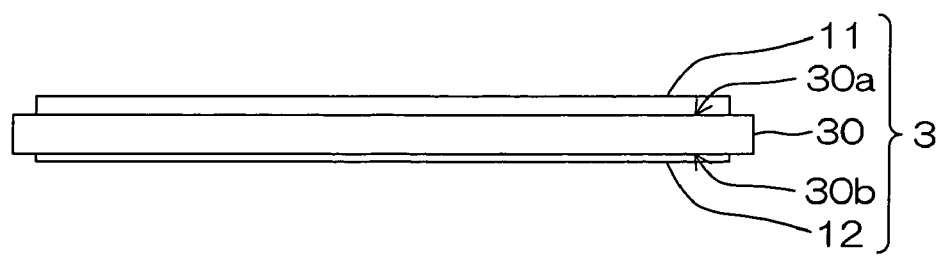
FIG. 3 A schematic side view of the semiconductor device assembly shown in FIG. 2.

FIG. 2 is a perspective view of a semiconductor device assembly 3 formed of an assembly of the semiconductor devices 1 shown in FIG. 1 observed from a front surface 30a side, and FIG. 3 is a schematic side view of the same.

The semiconductor device 1 is obtained by cutting the semiconductor device assembly 3 formed of an assembly of a plurality of the semiconductor devices 1 with a dicing blade, etc., (not shown) along dicing lines L set between the respective semiconductor chips 10 into pieces each including one semiconductor chip 10.

The semiconductor device assembly 3 includes a substrate 30 in which a plurality of the semiconductor chips 10 are formed, a front side resin layer 11 formed on the front surface 30a (front surface 10a of each semiconductor chip 10) of the substrate 30 by using a bisphenol-A type epoxy resin, and a back side resin layer 12 formed to be thinner than the front side resin layer 11 on a back surface 30b of the substrate 30 by using polyimideamide.

The front side resin layer 11 and the back side resin layer 12 are formed as follows. That is, when the front side resin layer 11 and the back side resin layer 12 are formed, a bisphenol-A type epoxy resin as the material of the front side resin layer 11 is applied onto the front surface 30a of the substrate 30. In addition, polyimideamide as the material of the back side resin layer 12 is applied onto the back surface 30b of the substrate 30. At this time, polyimideamide is applied thinner than the bisphenol-A type epoxy resin applied onto the front surface 30a of the substrate 30. Thereafter, these resins are heated to approximately 170° C. through 180° C. together with the substrate 30, and then cooled to a normal temperature (approximately 25° C.). Thereby, the bisphenol-A type epoxy resin on the front surface 30a of the substrate 30 and polyimideamide on the back surface 30b of the substrate 30 become cured, and a front side resin layer 11 and a back side resin layer 12 are formed on the front surface 30a and the back surface 30b of the substrate 30, respectively.

In cooling for forming the front side resin layer 11 and the back side resin layer 12 after heating, the bisphenol-A type epoxy resin applied onto the front surface 30a of the substrate 30 thermally shrinks, and polyimideamide applied onto the back surface 30b of the substrate 30 thermally shrinks. On the back surface 30b of the substrate 30, polyimideamide is applied thinner than the bisphenol-A type epoxy resin on the front surface 30a of the substrate 30. However, polyimideamide has a thermal expansion coefficient higher than that of the bisphenol-A type epoxy resin, so that to the back surface 30b of the substrate 30, a stress on generally the same level as that of a stress applied to the front surface 30a of the substrate 30 from the bisphenol-A type epoxy resin is applied from polyimideamide. Therefore, there is no risk that the substrate 30 warps.

By forming the back side resin layer 12 to be thinner than the front side resin layer 11, the thickness of the semiconductor device 1 obtained by cutting the semiconductor device assembly 3 can be made smaller than in the case where resin layers with the same thickness are formed on the front surface 30a side and the back surface 30b side of the substrate 30.

Furthermore, a resin material having a small elasticity modulus is used as the material of the back side resin layer 12, so that although the back side resin layer 12 is formed to be thin, an impact to be applied to the back side resin layer 12 can be sufficiently absorbed. Therefore, each semiconductor chip 10 can be sufficiently protected in the state of the semiconductor device assembly 3. In the semiconductor device 1 obtained from the semiconductor device assembly 3, the semiconductor chip 10 can be sufficiently protected.

Although the bisphenol-A type epoxy resin is used as an example of the first resin material and polyimideamide is used as an example of the second resin material, materials other than the materials used as the examples may be used as the first resin material and the second resin material as long as the thermal expansion coefficient of the second resin is higher than that of the first resin material and the elasticity modulus of the second resin material is smaller than that of the first resin material.

Figure 4:
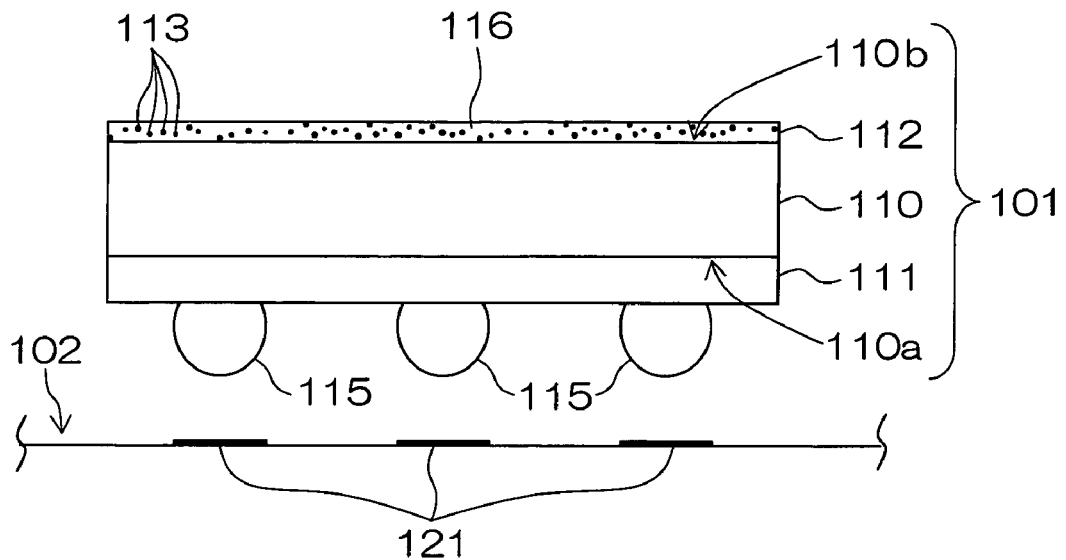
FIG. 4 A side view schematically showing a construction of a semiconductor device according to a second embodiment of the present invention.
Figure 5:
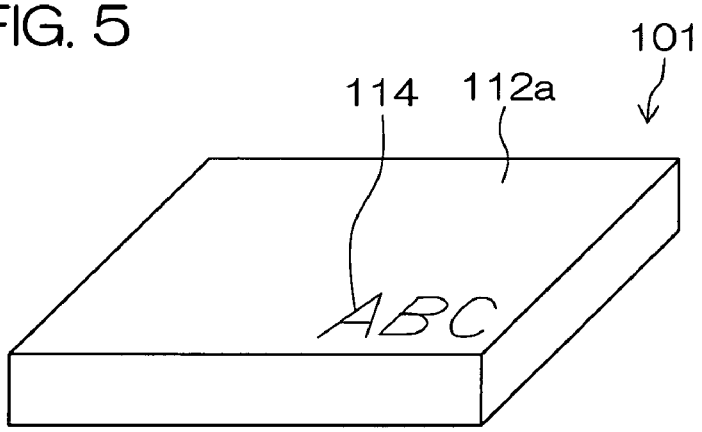
FIG. 5 A perspective view of the semiconductor device of FIG. 4.

FIG. 4 is a side view schematically showing a construction of a semiconductor device according to a second embodiment of the present invention. FIG. 5 is a perspective view of the semiconductor device.

This semiconductor device 101 is a semiconductor device employing a WL-CSP (Wafer Level-Chip Size Package). The semiconductor device 101 includes a semiconductor chip 110.

The semiconductor chip 110 has a thickness of, for example, 300 to 400 µm. In the surface layer portion of this semiconductor chip 110, function elements (not shown) are formed. A front surface 110a of the semiconductor chip 110 is covered by a passivation film (not shown). On the passivation film, a polyimide layer and rewiring (not shown) are formed. On the front surface 110a of the semiconductor chip 110, a front side resin layer 111 for sealing the rewiring, etc., is formed. This front side resin layer 111 has a thickness of, for example, 40 to 100 µm.

On the front side resin layer 111, a plurality of external terminals 115 for connection to a mounting substrate 102 are provided. The plurality of external terminals 115 are arranged in a lattice pattern at the central portion of the front side resin layer 111 side. Each external terminal 115 is formed in a ball shape, and electrically connected to the semiconductor chip 110 of the semiconductor device 101. In this semiconductor device 101, mounting on the mounting substrate 102 is realized by bringing the respective external terminals 115 into contact with respective lands 121 on the mounting substrate 102.

On the other hand, on a back surface 110b of the semiconductor chip 110, a back side resin layer 112 for protecting the back surface 110b and preventing warping of the semiconductor chip 110 is formed. This back side resin layer 112 has a thickness of, for example, 10 to 20 µm.

As the resin material forming the back side resin layer 112, a material obtained by mixing filler 113 in a range not less than 5 weight percent and not more than 10 weight percent in a resin 116 such as an epoxy resin is used. The filler 113 is, for example, silica particles, and a particle size thereof is 2 µm on average and not more than 10 µm at a maximum.

On a surface 112a of the back side resin layer 112, as shown in FIG. 5, the manufacturer name and product number, etc., are marked.

Figure 6:
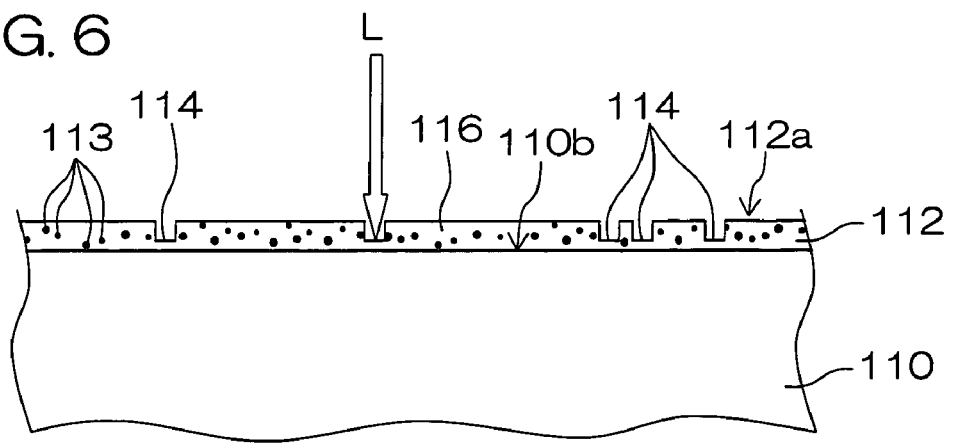
FIG. 6 A side view showing the surface of the back side resin layer shown in FIG. 4 in an enlarged manner for describing a method for marking a manufacturer name and a product number, etc., on the surface of the back side resin layer.

FIG. 6 is a side view showing the surface 112a of the back side resin layer 112 in an enlarged manner for describing a method for marking a manufacturer name, etc., on the surface 112a of the back side resin layer 112 shown in FIG. 4.

The manufacturer name, etc., is engraved on the surface 112a of the back side resin layer 112 by laser machining. That is, the surface 112a of the back side resin layer 112 is irradiated with a laser beam L to chip the resin from the irradiated surface portion and form fine concave grooves 114, thereby the manufacturer name, etc., is engraved.

As in this semiconductor device 101, by forming the back side resin layer 112 with a resin material containing the filler 113 mixed in a range not less than 5 weight percent and not more than 10 weight percent in the resin 116, the surface 112a of the back side resin layer 112 can be prevented from becoming greatly uneven due to the filler 113 while the luster on the surface 112a of the back side resin layer 112 can be reduced. Therefore, the concave grooves 114 formed by irradiation of the laser beam L can be easily distinguished, and the visibility can be improved.

As an example of the semiconductor device 101, a semiconductor device employing a WL-CSP has been shown. However, the present invention is not limited to the semiconductor device employing the WL-CSP, and is also widely applicable to semiconductor devices which have a back side resin layer on the back surface of the semiconductor chip and include a manufacturer name and a product number, etc., marked on the back side resin layer.

Moreover, various design changes can be made within the scope of the matters described in the Claims. That is, the above-described embodiments are only specific examples used for clarifying technical contents of the present invention, and the present invention should not be interpreted limitedly to these specific examples, and the spirit and scope of the present invention are limited only by the accompanying Claims.

This application corresponds to Japanese Patent Applications No. 2005-189571 and No. 2005-189572 filed on Jun. 29, 2005 to the Japan Patent Office, and whole disclosures of these applications are incorporated herein by reference.

What is claimed is:

1. A semiconductor device comprising:
   a semiconductor chip, a function element being formed on a side corresponding to a front surface of the semiconductor chip;
   a front side resin layer formed on the front surface of the semiconductor chip;
   a back side resin layer formed on a back surface of the semiconductor chip, the back side resin layer being formed to be thinner than the front side resin layer,
   wherein a groove is formed on the back side resin layer, and a plurality of external terminals are formed on the front side resin layer,
   the groove includes engraved indicating information regarding the semiconductor device,
   the back side resin layer has a higher thermal expansion coefficient than that of the front side resin layer, and
   the back side resin layer has a smaller elasticity modulus than that of the front side resin layer, wherein the elasticity modulus is Young's modulus.

2. The semiconductor device according to claim 1, wherein the semiconductor chip has a thickness of 300 to 400 µm.

3. The semiconductor device according to claim 1, wherein the front side resin layer has a thickness of 40 to 100 µm.

4. The semiconductor device according to claim 1, wherein the plurality of external terminals are arranged in a lattice pattern.

5. The semiconductor device according to claim 1, wherein each external terminal is formed in a ball shape.

6. The semiconductor device according to claim 1, wherein the back side resin layer has a thickness of 10 to 20 µm.

7. The semiconductor device according to claim 1, wherein the back side resin layer includes an epoxy resin.

8. The semiconductor device according to claim 1, wherein the back side resin layer includes a filler.

9. The semiconductor device according to claim 8, wherein a content of the filler in the back side resin layer is in a range not less than 5 weight percent and not more than 10 weight percent.

10. The semiconductor device according to claim 8, wherein the filler includes silica particles.

11. The semiconductor device according to claim 10, wherein a particle size of the silica particle is not more than 10 µm at a maximum.

12. The semiconductor device according to claim 1, wherein the groove does not reach to the semiconductor chip.

13. A semiconductor device comprising:
   a semiconductor chip, a function element being formed on a side corresponding to a front surface of the semiconductor chip;
   a front side resin layer formed on the front surface of the semiconductor chip;
   a back side resin layer formed on a back surface of the semiconductor chip, the back side resin layer being formed to be thinner than the front side resin layer, wherein a groove which does not reach to the semiconductor chip is formed on the back side resin layer, and a plurality of external terminals are formed on the front side resin layer, the plurality of external terminals being arranged in a lattice pattern, each external terminal being formed in a ball shape, the groove includes engraved indicating information regarding the semiconductor device, the back side resin layer has a higher thermal expansion coefficient than that of the front side resin layer, and the back side resin layer has a smaller elasticity modulus than that of the front side resin layer, wherein the elasticity modulus is Young's modulus.

14. The semiconductor device according to claim 13, wherein the semiconductor chip has a thickness of 300 to 400 μm.

15. The semiconductor device according to claim 13, wherein the front side resin layer has a thickness of 40 to 100 μm.

16. The semiconductor device according to claim 13, wherein the back side resin layer has a thickness of 10 to 20 μm.

17. The semiconductor device according to claim 13, wherein the back side resin layer includes an epoxy resin.

18. The semiconductor device according to claim 13, wherein the back side resin layer includes a filler.

19. The semiconductor device according to claim 18, wherein a content of the filler in the back side resin layer is in a range not less than 5 weight percent and not more than 10 weight percent.

20. The semiconductor device according to claim 18, wherein the filler includes silica particles.

21. The semiconductor device according to claim 20, wherein a particle size of the silica particle is not more than 10 μm at a maximum.

* * * * *